United States Patent
Ghosh

Patent Number: 5,959,725
Date of Patent: Sep. 28, 1999

[54] LARGE AREA ENERGY BEAM INTENSITY PROFILER

[75] Inventor: Amalkumar P. Ghosh, Poughkeepsie, N.Y.

[73] Assignee: Fed Corporation, Hopewell Junction, N.Y.

[21] Appl. No.: 09/018,466

[22] Filed: Feb. 4, 1998

Related U.S. Application Data

[60] Provisional application No. 60/052,240, Jul. 11, 1997.

[51] Int. Cl.[6] .................................................... G01J 1/00
[52] U.S. Cl. ........................................... 356/121; 250/205
[58] Field of Search .............................. 356/121; 250/205

[56] References Cited

U.S. PATENT DOCUMENTS

| | | |
|---|---|---|
| 4,320,462 | 3/1982 | Lund et al. .............................. 356/121 |
| 4,585,342 | 4/1986 | Lin et al. . |
| 4,693,600 | 9/1987 | Cross et al. .............................. 356/121 |
| 4,828,384 | 5/1989 | Plankenhorn et al. . |
| 4,848,902 | 7/1989 | Schickle et al. . |
| 5,058,988 | 10/1991 | Spence . |
| 5,214,485 | 5/1993 | Sasnett et al. . |
| 5,258,821 | 11/1993 | Doggett et al. . |
| 5,267,013 | 11/1993 | Spence . |
| 5,426,686 | 6/1995 | Rentzepis et al. . |
| 5,591,564 | 1/1997 | Rostoker et al. . |
| 5,642,374 | 6/1997 | Wakabayashi et al. ................... 372/57 |

*Primary Examiner*—F. L. Evans
*Attorney, Agent, or Firm*—Collier, Shannon, Rill & Scott, PLLC

[57] ABSTRACT

A large area energy beam intensity profiler and method of profiling are disclosed. The profiler includes intensity detectors which generate electrical signals corresponding to the intensity of the beam. The output of the detectors is processed by a computer and displayed on a monitor. The invention provides for adjustment of the beam in response to a nonuniform intensity profile, or an indication that the beam is misaligned.

28 Claims, 5 Drawing Sheets

LARGE AREA ENERGY BEAM INTENSITY PROFILER

CROSS REFERENCE TO RELATED PATENT APPLICATION

This application claims priority to U.S. Provisional Application Ser. No. 60/052,240 entitled "LARGE AREA LASER BEAM INTENSITY PROFILER" filed on Jul. 11, 1997.

FIELD OF THE INVENTION

The invention relates to a method and apparatus for measuring the intensity profile of an energy beam. In particular, the present invention relates to measuring the intensity profile of large area laser beams used for laser interference lithography.

BACKGROUND OF THE INVENTION

Laser interference lithography involves using a laser beam to produce fringe patterns on a layer of photoresist. A basic form of laser interference lithography uses two overlapping and coherent laser beams. The two overlapping beams may be used to produce straight line interference fringe patterns in two orthogonal directions on a layer of photoresist. The exposure of the photoresist to the beams may be conducted in two steps. In step one, the photoresist is oriented so that exposure to the beams creates a fringe pattern in a certain direction, for example the x-axis. In step two, the photoresist layer may be rotated approximately 90 degrees so that the resulting fringe pattern is in a direction orthogonal to that created in step one, for example the y-axis. The resulting overall fringe pattern consists of two sets of straight line interferences perpendicular to one another.

Laser interference lithography may be employed on either positive or negative tone photoresist. In the case of positive tone resist, the exposed regions of the photoresist are developed away and the unexposed regions remain as resist dots or bumps. In the case of negative tone resist, the exposed regions remain while the unexposed regions develop away giving rise to holes in the photoresist. Thus, either resist dots or holes can be generated using this technique, in addition to lines and spaces. Typically, due to the surface tension of the resist material, what would otherwise be square features resulting from the laser interference develop rounded comers. Other patterns may also be generated using this method, such as elongated dots, holes or mesa structures.

The feature size of the fringe patterns is determined by various exposure and development parameters. However, feature size is also influenced by the feature-to-feature spacing, which can be determined from the following equation:

$$2d\sin\theta = \lambda$$

where d is fringe spacing, $\lambda$ is the wavelength of laser light, and $\theta$ is the half angle between the two beams. Since the fringe pattern and the fringe dimensions are solely a function of the angle between the two interfering beams, the feature size may be made as small as desired, limited only by the processing parameters.

When used in the production of field emission devices, laser interference lithography may require laser beams to be expanded to very large dimensions, e.g. as large as 1 meter in diameter. The intensity profile of the light across the large area laser beam should be as uniform as possible (within ±10%). Uniform laser intensity is desired in order for the photoresist to be patterned within the required size tolerances.

An accurate beam profile may be used to monitor and adjust the uniformity of the beam. Furthermore, because the optical components, such as mirrors, may be very large for such large diameter laser beams, it can be difficult to align the laser beam to the center of these optical components without an accurate intensity profile of the beam. It is therefore desirable to be able to accurately monitor the laser beam intensity profile and have the capability to adjust the beam's intensity and direction if necessary.

Current methods of measuring laser beam intensity cannot accommodate the large beam sizes and accuracy requirements of laser beams used with laser interference lithography. For example, U.S. Pat. No. 4,828,384 issued to Plankenhom et al., discloses a high power laser beam intensity mapping apparatus. The Plankenhom system is designed to obtain profiles of high power industrial use lasers on the order of 15 kW or more. The lasers disclosed in the Plankenhom system are larger and more powerful than the lasers used for laser interference lithography, which are typically on the order of 1 W and have a smaller diameter than the high power lasers. The system disclosed in the Plankenhorn patent, does not analyze the entire beam cross-section (i.e. a diameter), but instead only samples a slit-shaped segment of the beam. However, due to variances between the segment and the remaining portion of the beam this method will not always provide an accurate indication of the intensity beam profile.

The current methods of profiling laser beams do not provide the accuracy required for laser interference lithography. Therefore, there is a need for a method and apparatus for more accurately profiling a large area laser beam for use with laser interference lithography.

OBJECTS OF THE INVENTION

It is therefore an object of the present invention to provide an improved method for determining the profile of a large area energy beam.

It is another object of the present invention to provide an improved apparatus for measuring the intensity of a large area energy beam.

It is a further object of the present invention to provide a method for adjusting an energy beam in response to a beam profiler to create a more uniform beam intensity distribution.

It is still another object of the present invention to provide an apparatus for measuring the intensity of a large area energy beam, and for adjusting the beam profile to provide a more uniform distribution.

It is yet a further object of the present invention to provide a method and apparatus for adjusting the direction of a large area energy beam.

Additional objects and advantages of the invention are set forth, in part, in the description which follows and, in part, will be apparent to one of ordinary skill in the art from the description and/or from the practice of the invention.

SUMMARY OF THE INVENTION

In response to the foregoing challenges, the Applicant has developed an innovative, economical method and apparatus for profiling an energy beam.

The beam intensity profiler of the present invention may comprise: a profiling member located in the path of the beam substantially perpendicular to the direction of the beam transmission, wherein the profiling member is exposed to substantially the entire beam cross-section; and a plurality of intensity detectors mounted on the profiling member disposed toward the beam. The intensity detectors may include photodiodes capable of generating an output signal corresponding to the intensity of the beam. The profiler may also include a means for displaying the output signal. The means for displaying the output signal may be capable of displaying a variety of information representative of the beam's profile including: the average output signal of the photodiodes; the relative and absolute intensity of the beam at each photodiode; the percentage difference between the highest and lowest output signal generated by the photodiodes; the instantaneous output of each photodiode; and displaying a three dimensional plot of the beam's intensity profile. The beam profiler of the present invention is also capable of sampling the output signal of each photodiode periodically and displaying the average of the sampled values. The means for displaying the output signal may display the output signal from a group of photodiodes selected from the plurality of photodiodes. The profiling member may be formed in any of a variety of different shapes, including cross-shaped; an elongated bar; a wheel shape; or a substantially planar surface. The profiling member may comprise a substantially planar surface encompassing at least the same area as the cross-section of the beam.

The beam intensity profiler of the present invention may comprise: a profiling member adapted to be exposed to a substantial portion of a diameter of the beam at one time; a means for rotating the profiling member; a means for detecting the beam intensity, located on the profiling member; and a means for displaying a beam intensity profile. The means for detecting the beam intensity may comprise a plurality of photodiodes. The means for rotating the profiling member may include a motor. The means for displaying the beam intensity profile may include a personal computer and a monitor.

The present invention includes a device for measuring the intensity profile of a laser beam which comprises: a support; a profiling member mounted to the support; a means for rotating the profiling member; a plurality of photodiodes located on the profiling member, wherein each of the plurality of photodiodes is capable of generating an output signal corresponding to the intensity of the laser beam; a means for displaying the output signal; and a means for adjusting the laser beam in response to the output signal of the plurality of photodiodes. The means for adjusting the laser beam may be capable of automatically adjusting the laser beam in response to the output signal of the photodiodes. The means for displaying the output signal may include a computer and a color monitor.

The method for profiling an energy beam according to the present invention comprises the steps of: detecting the intensity of the beam across a substantial portion of the diameter of the beam at one time; generating an output signal related to the detected intensity of the beam; processing the output signal within a computer; and displaying a beam profile related to the processed output signal. The detecting step may include placing a plurality of photodiodes, each capable of generating an output signal in the path of the beam. The step of displaying the beam profile may include displaying the percentage difference between the highest magnitude and lowest magnitude output signal and displaying the instantaneous voltage from each of the photodiodes. The step of calibrating the detection means includes placing the detection means in the path of the energy beam. The method may further comprise the steps of: detecting the intensity of the beam across a substantial portion of a second diameter of the beam at one time; and repeating the steps set forth above, namely generating an output signal; processing the output signal; and displaying the beam profile.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

DETAILED DESCRIPTION OF THE INVENTION

Figure 1:
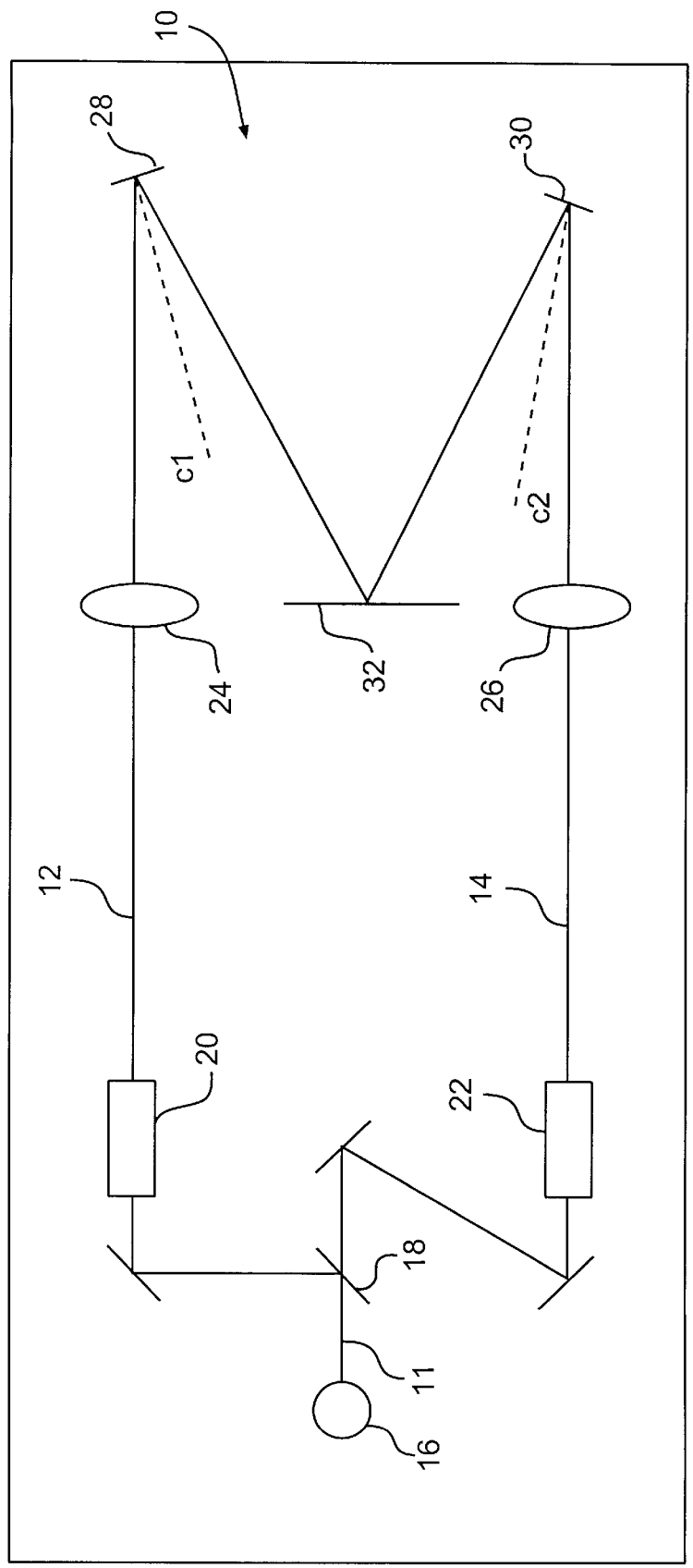
FIG. 1 is a block diagram of a system used for laser interference lithography.

FIG. 1 shows a typical arrangement of a laser beam system for laser interference lithography. A laser beam 11 may be produced by a continuous wave ("CW") ion laser 16. A typical laser used for laser interference lithography may be an Argon ion laser, which is capable of generating a beam with a large coherence length. Initially, the laser beam 11 may be split into two parts by a beam splitter 18. Next, each of the two beams 12 and 14 may pass through spatial filters, 20 and 22. The spatial filters, 20 and 22, may assist in removing excess intensity noise in the beam. After exiting the spatial filters, 20 and 22, the beams, 12 and 14, are typically diverging. As a result, in some applications it will be necessary to collimate the beams. In other applications it is not critical to collimate the beams and this step can be omitted. The beam collimators 24, 26 typically comprise lens systems whose focal lengths are equal to the distance between the lens and the spatial filler. Finally, the beams, 12 and 14 may be directed by adjustable mirrors, 28 and 30, onto a work piece including a photoresist layer 32. The beams may overlap at a predetermined angle created by the position of the folding mirrors 28 and 30.

Figure 2:
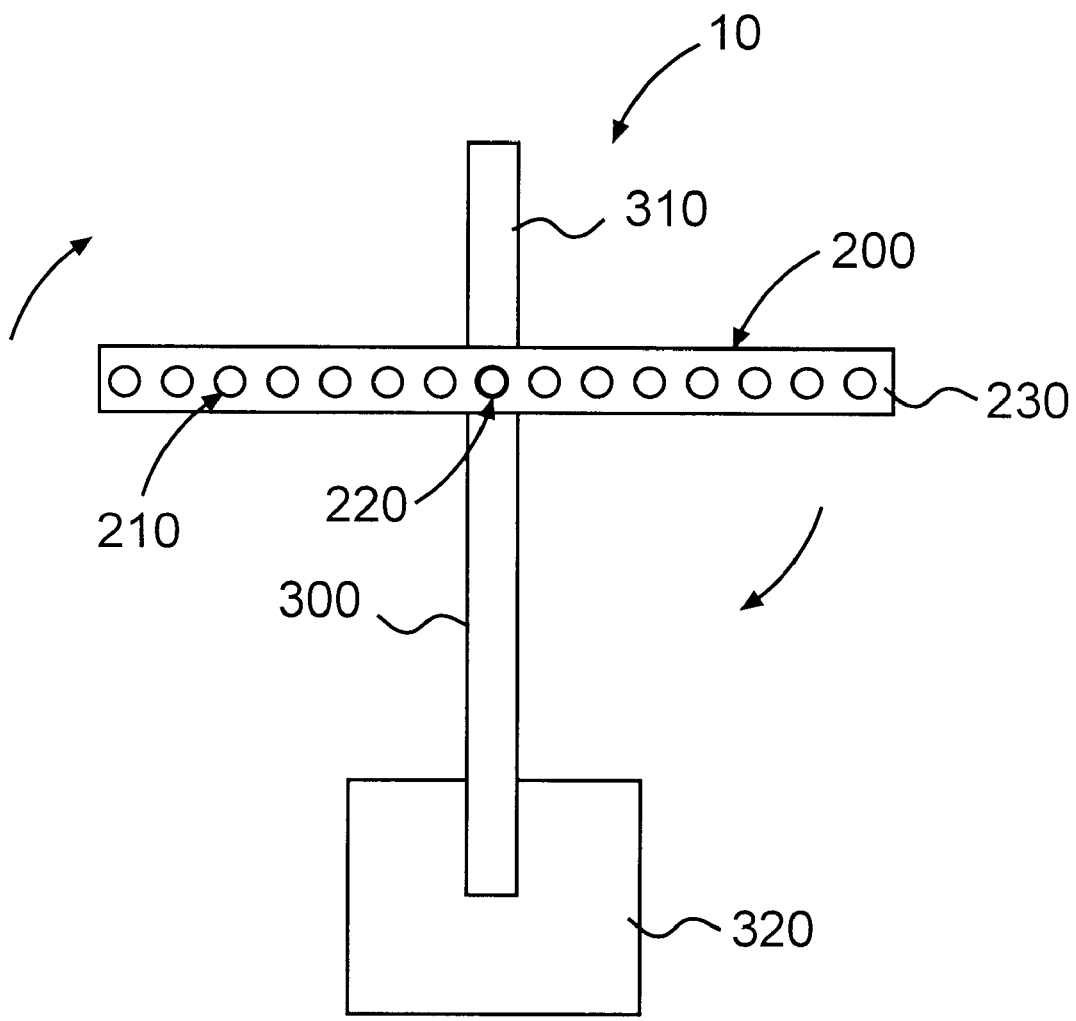
FIG. 2 is a pictorial view of one embodiment of the present invention.

An embodiment of the beam intensity profiler 10 of the present invention is disclosed in FIG. 2. The beam profiler 10 disclosed in FIG. 2 may be comprised of a profiling member 200 and a stand (or support) 300. Profiling member 200 may be attached to the stand 300 at pivot point 220. Mounted on the profiling member 200 are a plurality of energy detectors 210. The energy detectors may be equally spaced along the profiling member 200. The energy detectors 210 are chosen to respond to the wavelength of the particular beam being profiled. For example, in the case of a CW ion laser, used for laser interference lithography, energy detectors comprising photodiodes are preferred. An example of photodiodes which may be used are Hamamatsu 18BQ photodiodes.

The profiling member 200 may be comprised of an elongated bar 230 formed from any appropriate material.

Suitable materials include plexiglass, fiberglass and plastic. The bar 230 may be of sufficient length to intersect substantially an entire diameter (or cross-section) of the energy beam. It is preferred that the profiling member be exposed to the entire beam cross-section at one time, however, it is within the scope of the present invention that only a substantial portion (at least 50 percent) of the beam cross-section intersects the profiling member. When profiling the large area energy beams used for laser interference lithography, a bar 230 of approximately one meter in length may be required. The profiling member 200 may be rotatably attached to the stand 300. The member 200 may be rotated a full 360 degrees in order to profile the entire beam 100. The length of stand 300 may be adjusted so that the profiling member 200 may be positioned vertically to intersect the energy beam.

The beam profiler 10 may be used at several different stages of the process described above. With renewed reference to FIG. 1, preferentially, a beam profiler designed according to the present invention may be used to measure the intensity profile of the combined beam just prior to the beam 11 interfering with the photoresist layer 32. The beam profiler 10 may also be used to align the beam's position relative to the large optical elements used in the process. For example, the beam profiler 10 may be placed in front of any optical element, such as lenses, 24 and 26; mirrors, 28 and 30; or spatial filters, 20 and 22 in order to determine the beam's position relative to the optical element.

Figure 3:
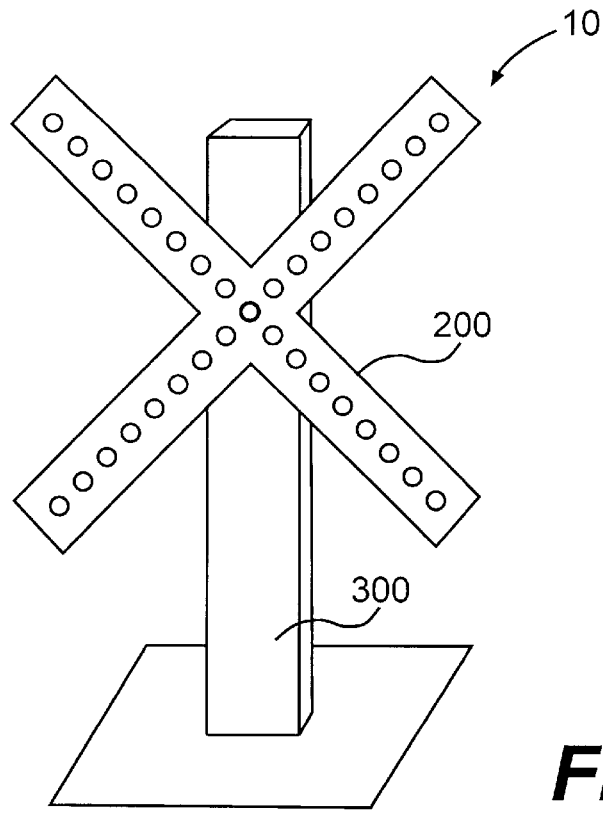
FIG. 3 is a pictorial view of an alternative embodiment of the present invention.
Figure 4:
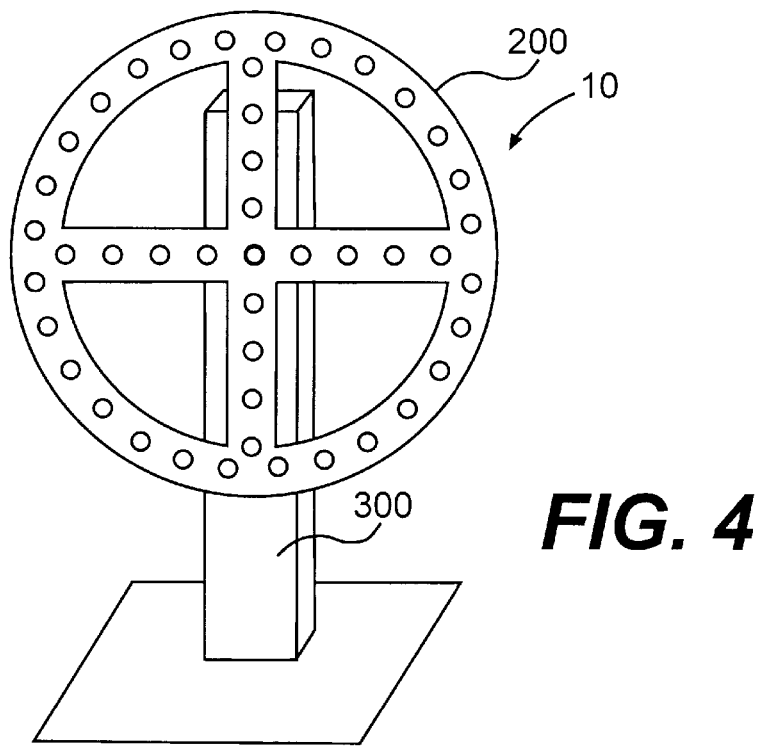
FIG. 4 is a pictorial view of a second alternative embodiment of the present invention.
Figure 5:
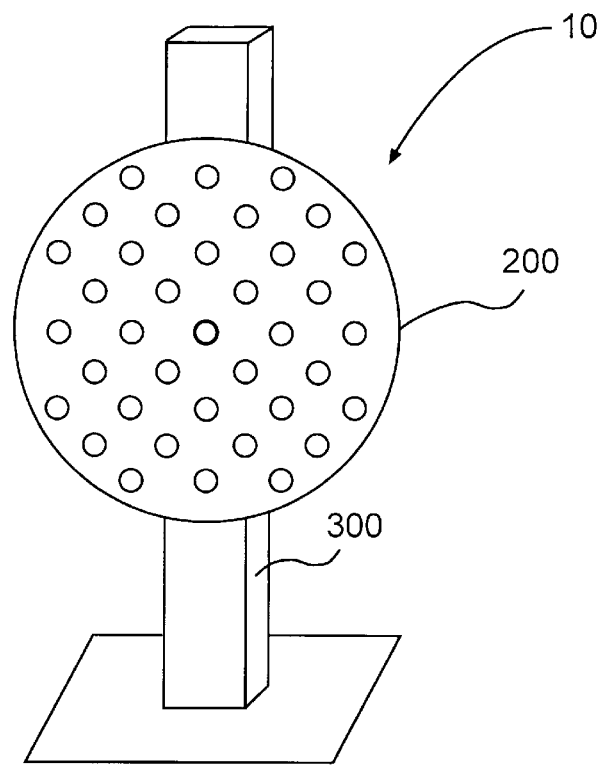
FIG. 5 is a pictorial view of a third alternative embodiment of the present invention.

FIGS. 3–5 disclose three alternative embodiments of the present invention. The profiling member 200 disclosed in FIG. 3, is cross shaped and may either be fixedly or rotatably attached to stand 300. Similarly, the wheel shaped profiling member 200 disclosed in FIG. 4, may either be fixed or capable of rotating. When a rotating profiling member 200 is desired, a motor may be used (see description of FIG. 6).

The profiling member 200 disclosed in FIG. 5, is disc shaped. The disc shaped design of the profiling member 200 may enable substantially the entire cross-section of the energy beam to be profiled without rotating the disc. However, the present invention also includes the use of a disc shaped profiling member which is capable of rotating. The disc 200 may be required to rotate if a substantial portion of the beam cross-section is not exposed to photodiodes. While a disc shaped member is disclosed in FIG. 5, any substantially planar member capable of intersecting the entire beam would be within the scope of the present invention.

Figure 6:
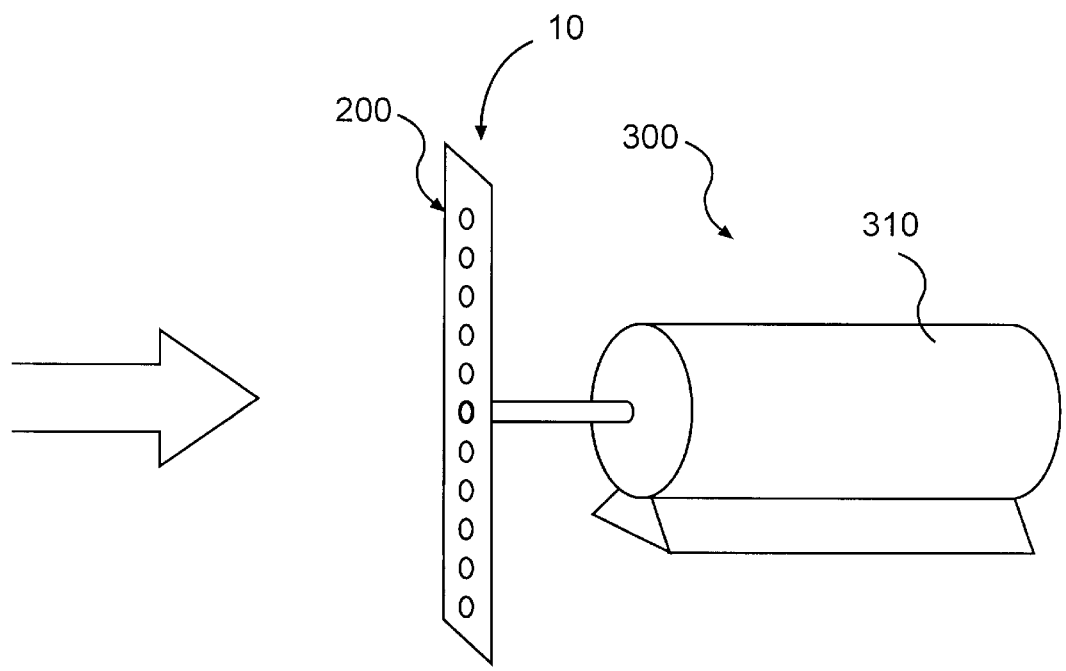
FIG. 6 is a pictorial view of a fourth alternative embodiment of the present invention.

FIG. 6 discloses an alternative embodiment of the beam profiler 10 of the present invention. The profiling member 200 is attached to the stand (or support) 300, which includes a motor 310 for rotating the profiling member 200. The motor 310 may selectively rotate the profiling member 200 within the energy beam. The rotating member 200 is capable of providing a continuous intensity profile for substantially the entire cross-section of the beam. The motor 310 is preferably a simple variable speed electric motor. The speed of the motor 310 may be controlled manually, or automatically in response to a computer generated signal.

Figure 7:
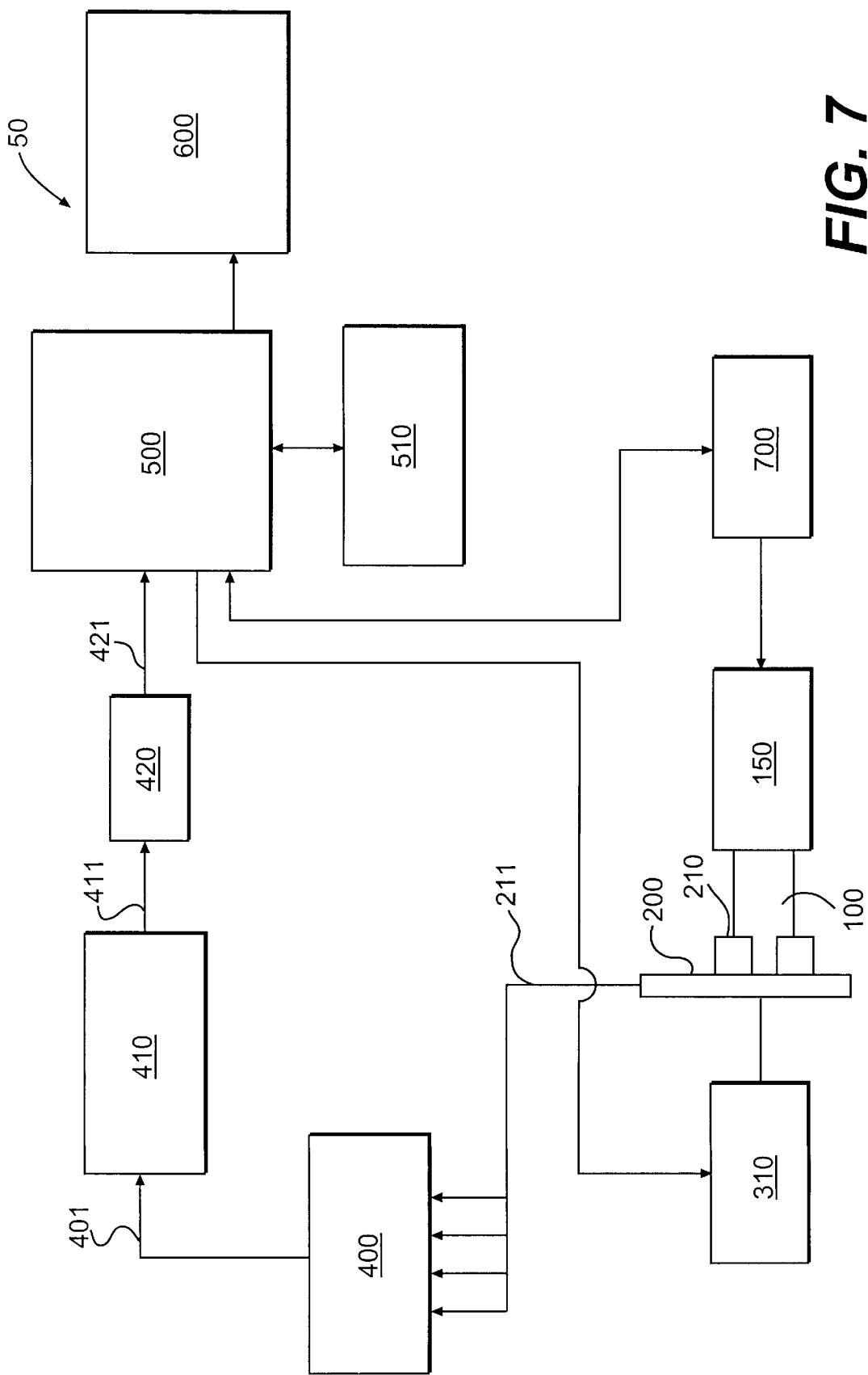
FIG. 7 is a block diagram of a large area energy beam intensity profiler system of the present invention.

FIG. 7 discloses a flow chart of the signal processing system 50 of the present invention. Each energy detector 210 may produce an analog output signal 211 proportional to the intensity of the beam 100 that impinges on member 200. The analog signals 211 may be enhanced by an amplifier 400 in order to produce an improved signal to noise ratio. The amplified signals 401 may be applied to a multiplexer 410, which may produce signals 411 that are passed to an analog-to-digital converter 420. Digital signals 421, proportional to the beam intensity, may be provided to a general purpose computer 500, which may be of the personal computer type. The user may interact with the computer 500 using a standard computer keyboard 510. Also, connected to the computer 500 is a display device 600. Display device 600 is preferably in the form of a high resolution color monitor.

The computer 500 processes the digital intensity signals 421, and may display a variety of different information regarding the beam intensity. Data from the energy detectors 210 may be displayed graphically. The absolute intensity of the beam 100 at a particular energy detector may be displayed. The average intensity readings from all or a portion of the energy detectors may also be displayed. The system also may be capable of displaying the intensity of the beam 100 at a particular detector relative to an average intensity reading. Further, the system may be capable of displaying the percentage difference between the highest and lowest intensity readings. This percentage difference is a measure of the beam's uniformity. As stated above, the system 50 also may be capable of isolating certain detectors 210 for analysis. The display may represent the beam's intensity profile as measured by any group of detectors.

The system 50 may sample the beam's intensity approximately 100 times a second. The display may be capable of updating every second and represents the average of the 100 samples. The sampling rate is adjustable, but a rate of approximately 100 times per second is preferred.

The system 50 and computer 500 may be calibrated for each energy detector 210. During calibration, the energy detector 210 is exposed to a beam of known intensity. The system 50 monitors the laser intensity incident on the detector 210 being calibrated and displays the average and instantaneous voltage. The detector output may be adjusted so that the known value of beam intensity is displayed. The calibration factor for each detector 210 is stored in memory until the calibration process is repeated.

Once the data received from the energy detectors 210 has been analyzed, it may be necessary to adjust the laser 150 in order to achieve a more uniform distribution. A command may be entered on the keyboard 510 in order to send a signal 502 to the control unit 700 via the computer 500. The control unit 700 is capable of adjusting both the position and the intensity of the laser. The laser's position and intensity may also be adjusted automatically if desired. The control unit 700 may automatically adjust the position of the laser 150 in response to a signal from the computer 500.

The user may also control the beam profiler 10 through the computer 500 and keyboard 510. For example, the profiling member 200 may be rotated by the motor 310 so that the laser beam can be profiled automatically in both the x and y directions and a 3D plot of the laser intensity profile may be generated.

It will be apparent to those skilled in the art that various modifications and variations can be made in the construction, configuration, and/or operation of the present invention without departing from the scope or spirit of the invention. For example, in the embodiments described above, various changes may be made to the design of the profiling member 200 such as the shape and size of the member, as well as the choice and spacing of the energy electors, without departing from the scope and spirit of the invention. Thus, it is intended that the present invention cover the modifications and variations of the invention provided they come within the scope of the appended claims and their equivalents.

I claim:

1. A beam intensity profiler for measuring the intensity of an energy beam, said beam intensity profiler comprising:
   a profiling member located in the path of the beam substantially perpendicular to the direction of the beam transmission, wherein said profiling member is exposed to a substantial portion of the beam cross-section, said profiling member further being capable of rotation;
   a plurality of intensity detectors mounted on said profiling member disposed toward the beam;
   rotation means for rotating said profiling member about an axis parallel to the direction of beam transmission; and
   control means for controlling the operation of said rotation means to control the rotation of said profiling member.

2. The beam intensity profiler of claim 1, wherein said plurality of intensity detectors include a plurality of photodiodes.

3. The beam intensity profiler of claim 2, wherein each of said photodiodes generates an output signal corresponding to the intensity of the beam at that photodiode.

4. The beam intensity profiler of claim 3, further comprising display means for displaying the output signal.

5. The beam intensity profiler of claim 4, wherein said means for displaying the output signal is capable of displaying the average output signal of said plurality of photodiodes.

6. The beam intensity profiler of claim 5, wherein said means for displaying the output signal is capable of displaying the relative and absolute intensity of the beam at each of said plurality of photodiodes.

7. The beam intensity profiler of claim 4, wherein said means for displaying the output signal is capable of displaying the percentage difference between the highest and lowest output signal being generated by said plurality of photodiodes.

8. The beam intensity profiler of claim 4, wherein said means for displaying the output signal is capable of displaying the output signal from a group of photodiodes selected from said plurality of photodiodes.

9. The beam intensity profiler of claim 4, wherein said means for displaying the output signal is capable of periodically sampling the output signal from each photodiode and displaying the average output signal.

10. The beam intensity profiler of claim 4, wherein said means for displaying the output signal is capable of displaying the instantaneous output from each of said plurality of photodiodes.

11. The beam intensity profiler of claim 4, wherein said means for displaying the output signal is capable of displaying a three dimensional plot of the beam intensity profile.

12. The beam intensity profiler of claim 1, wherein said profiling member comprises an elongated bar.

13. The beam intensity profiler of claim 1, wherein said profiling member comprises a cross shaped member.

14. The beam intensity profiler of claim 1, wherein said profiling member comprises a substantially planar surface encompassing at least the same area as the cross-section of the beam.

15. A beam intensity profiler for measuring the intensity of an energy beam, said beam intensity profiler comprising:
   a profiling member adapted to be exposed to a substantial portion of a diameter of the beam at one time, said profiling member being capable of rotation;
   rotation means for rotating said profiling member about an axis parallel to the direction of beam transmission;
   control means for controlling the operation of said rotation means to control the rotation of said profiling member;
   detection means for detecting the beam intensity, located on said profiling member; and
   display means for displaying a beam intensity profile.

16. The beam intensity profiler according to claim 15, wherein said detection means comprises a plurality of photodiodes.

17. The beam intensity profiler according to claim 15, wherein said rotation means includes a motor.

18. The beam intensity profiler according to claim 15, wherein said means for displaying the beam intensity profile comprises a personal computer.

19. The beam intensity profiler according to claim 15, wherein said means for displaying the beam intensity profile further comprises a monitor.

20. A device for measuring the intensity profile of a laser beam comprising:
   a support;
   a profiling member mounted to said support;
   rotation means for rotating said profiling member;
   control means for controlling the operation of said rotation means to control the rotation of said profiling member;
   a plurality of photodiodes located on said profiling member, wherein each of said plurality of photodiodes is capable of generating an output signal corresponding to the intensity of the laser beam;
   display means for displaying the output signal; and
   adjustment means for adjusting the laser beam in response to the output signal of said plurality of photodiodes.

21. The device according to claim 20, wherein said means for adjusting the laser beam is capable of automatically adjusting the laser beam in response to the output signal of said plurality of photodiodes.

22. The device according to claim 20, wherein said means for displaying the output signal includes a computer.

23. The device according to claim 22, wherein said means for displaying the output signal includes a color monitor.

24. A beam intensity profiler for measuring the intensity of an energy beam, said beam intensity profiler comprising:
   a profiling member located in the path of the beam substantially perpendicular to the direction of the beam transmission, wherein said profiling member is exposed to a substantial portion of the beam cross-section, wherein said profiling member comprises a cross shaped member; and
   a plurality of intensity detectors mounted on said profiling member disposed toward the beam.

25. The beam intensity profiler according to claim 24, further comprising:
   rotation means for rotating said profiling member about an axis parallel to the direction of beam transmission; and
   control means for controlling the operation of said rotation means to control the rotation of said profiling member.

26. The beam intensity profiler of claim 24, wherein each of said plurality of intensity detectors generates an output signal corresponding to the intensity of the beam at that detector.

27. The beam intensity profiler of claim 26, further comprising display means for displaying the output signal.

28. The beam intensity profiler of claim 27, wherein said display means is capable of displaying at least one of the average output signal of said plurality of detectors, the relative and absolute intensity of the beam at each of said plurality of detectors, the percentage difference between the highest and lowest output signal being generated by said plurality of detectors, the output signal from a group of detectors selected from said plurality of photodiodes, the average output signal from a periodic sampling of the output signal from each detector, the instantaneous output from each of said plurality of detectors, and a three dimensional plot of the beam intensity profile.

* * * * *